United States Patent [19]

Hasegawa

[11] Patent Number: 5,064,779

[45] Date of Patent: Nov. 12, 1991

[54] METHOD OF MANUFACTURING POLYCRYSTALLINE SILICON FILM

[75] Inventor: Seiichi Hasegawa, Kanazawa, Japan

[73] Assignee: President of Kanazawa University, Kanazawa, Japan

[21] Appl. No.: 472,954

[22] Filed: Jan. 31, 1990

[30] Foreign Application Priority Data

Feb. 8, 1989 [JP] Japan .................................. 1-29286

[51] Int. Cl.$^5$ ............................................. H01L 21/20
[52] U.S. Cl. .......................... 437/109; 148/DIG. 122; 437/233; 437/963
[58] Field of Search .................. 148/DIG. 1, DIG. 3, 148/DIG. 4, 22, 25, 48, 83, 90, 93, 122, 128, 152, 154, 169, 33, 33.1, 33.3; 427/53.1, 54.1; 437/81, 24, 25, 62, 83, 82, 101, 105, 106, 108, 109, 111, 112, 247, 233, 935, 943, 963, 967, 973

[56] References Cited

U.S. PATENT DOCUMENTS

| | | | |
|---|---|---|---|
| 3,976,511 | 8/1976 | Johnson | 437/62 |
| 4,497,683 | 2/1985 | Celler et al. | 437/112 |
| 4,662,059 | 5/1987 | Smeltzer et al. | 437/62 |
| 4,784,723 | 11/1988 | Sakurai | 437/83 |
| 4,814,292 | 3/1989 | Sasaki et al. | 437/83 |
| 4,918,028 | 4/1990 | Shirai | 437/81 |
| 4,942,058 | 7/1990 | Sano | 437/228 |

FOREIGN PATENT DOCUMENTS

| | | | |
|---|---|---|---|
| 0109323 | 7/1982 | Japan | 437/83 |
| 0082715 | 5/1984 | Japan | 437/83 |
| 0155121 | 9/1984 | Japan | 437/83 |
| 0236310 | 10/1988 | Japan | 437/83 |
| 0214139 | 8/1989 | Japan | 437/83 |

OTHER PUBLICATIONS

Kamins et al., "Properties of Plasma-Enhanced CVD Silicon Films", J. Electrochem Soc., vol. 129, No. 10, Oct. 1982, pp. 2331–2335.

The Journal of the Electrochemical Society, Mar. 1980, vol. 127, No. 3, pp. 686–690, T. I. Kamins, et al.

The Journal of Electrochemical Society, Oct. 1982, vol. 129, No. 10, pp. 2326–2331, T. I. Kamins, et al.

The Journal of Electrochemical Society, Oct. 1987, vol. 134, No. 10, pp. 2541–2545, P. Joubert, et al.

Japanese Journal of Applied Physics, May 1989, vol. 28, No. 5, pp. 829–835, Noriaki Fujiki, et al.

Journal of Applied Physics, Oct. 1988, vol. 64, No. 8, pp. 4154–4160, S. Hasegawa, et al.

Applied Physics Letters, Jul. 1989, vol. 55, No. 2, pp. 142–144, S. Hasegawa, et al.

Journal of Applied Physics, Aug. 1987, vol. 62, No. 4, pp. 1503–1509, K. T. Y. Kung, et al.

*Primary Examiner*—Olik Chaudhuri
*Assistant Examiner*—William Bunch
*Attorney, Agent, or Firm*—Oblon, Spivak, McClelland, Maier & Neustadt

[57] ABSTRACT

In a method of manufacturing a poly-Si film, silicon is deposited on a substrate by means of a thermal decomposition of a feed gas and plasma generation. The method comprises the step of arranging said substrate within a reaction apparatus, the step of introducing into said reaction apparatus a feed gas containing a silane-series gas for thermal decomposition of the feed gas at 500° to 800° C., and the step of generating plasma within the feed gas by applying power for generating the plasma simultaneously with the thermal decomposition, said power for plasma generation being controlled at a level lower than the power applied for forming a poly-Si film oriented in the <110> direction, so as to form a poly-Si film substantially oriented in the <100> direction and having a smooth surface.

14 Claims, 3 Drawing Sheets

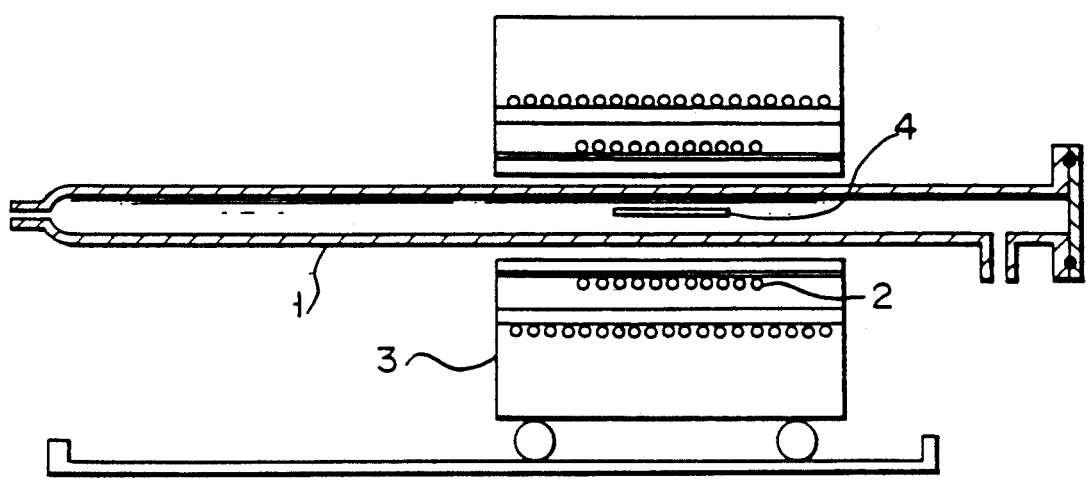
F I G. 1

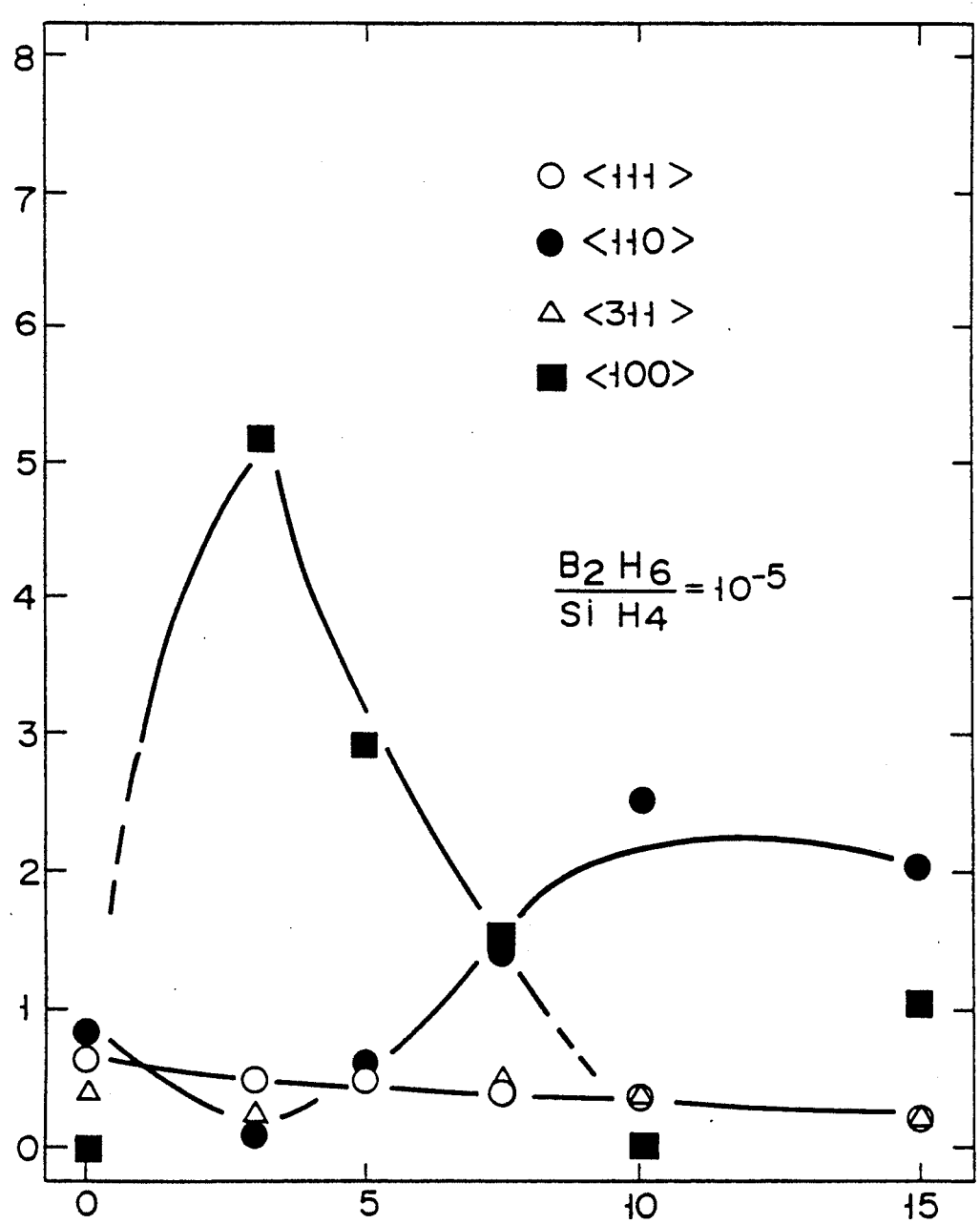
F I G. 3

METHOD OF MANUFACTURING POLYCRYSTALLINE SILICON FILM

BACKGROUND OF THE INVENTION

1. Field of the Invention

The present invention relates to a method of manufacturing a polycrystalline silicon (poly-Si) film oriented along the crystal axis <100> by utilizing plasma.

2. Description of the Related Art

Vigorous researches and developments are being made nowadays with respect to the increase in the crystal grain size and orientation of the crystal axis of a poly-Si film used in a thin film transistor. Where a structure of metal electrode-gate insulator film (silicon oxide film or the like)-silicon is employed in a thin film transistor, the density of a surface states at the interface between the gate insulator film and the silicon substrate, which resides near the conduction and valence band edges in the energy band gaps of a semiconductor, is strongly dependent on the crystal axis direction perpendicular to the silicon surface. It is reported that, in the case of a single-crystalline silicon, the surface state density in the <110> direction is about three times as high as that in the <100> direction, and that the density in the <111> direction is about 6 to 7 times as high as that in the <100> direction. Under the circumstances, a single-crystalline silicon having a surface along the <100> crystal axis is used for the above-noted purpose.

In the case of using a poly-Si film, it is of high industrial importance to develop a silicon film having the crystal axis direction of the crystal grains oriented in the <100> direction relative to the surface thereof.

Also, an interface unavoidably resides between crystal grains in a poly-Si. As a result, a potential barrier, which is caused by the interfacial potential (i.e., charge level formation between energy band gaps of a semiconductor), is generated between crystal grains. In order to suppress the effect given by the interface between the crystal grains, it is necessary to increase the crystal grain size.

A poly-Si film having the crystal axis oriented in the <100> direction can be obtained by controlling the gas pressure and the depositing temperature in the step of thermally decomposing a feed gas containing a silane-series gas under a low gas pressure. Where the deposition is performed at about 600° C. or lower in this method, however, the deposited silicon film certainly has a smooth surface, but is made amorphous. It is certainly possible to select conditions which permits deposition of a poly-Si film at about 600° C. or more. In this case, however, the deposited poly-Si film has a very rough surface. It should be noted that the surface roughness is greatly dependent on the degree of orientation. If the degree of orientation is high, the surface roughness is increased to reach 0.2 μm or more.

For preventing the surface roughness, it is known to the art to deposit first an amorphous silicon film by the pyrolytic deposition method at a depositing temperature of about 600° C. or less, followed by annealing the amorphous silicon film at about 600° C. or less for the solid phase crystallization. This method is certainly effective for obtaining a poly-Si film having a smooth surface and a large crystal grain size, but is incapable of controlling the crystal axis direction of the grown crystal grains. It follows that the crystal axis is positioned at random or is slightly oriented in the <111> direction in many cases, resulting in failure to manufacture a poly-Si film oriented in <100> direction.

SUMMARY OF THE INVENTION

The present invention is intended to provide a method of manufacturing a poly-Si film having the crystal axis strongly oriented in the <100> direction and having a very smooth flat surface.

According to the present invention, there is provided a method of manufacturing a poly-Si film, in which silicon is deposited on a substrate by means of a thermal decomposition of a feed gas and plasma generation, comprising the step of arranging said substrate within a reaction apparatus; the step of introducing into said reaction apparatus a feed gas containing a silane-series gas for thermal decomposition of the feed gas at 500 to 800° C.; and the step of generating plasma within the feed gas by applying power for the plasma generation simultaneously with the thermal decomposition, said power for plasma generation being controlled at a level lower than the power applied for forming a poly-Si film oriented in the <110> direction, so as to form a poly-Si film substantially oriented in the <100> direction and having a smooth surface.

The expression "substantially oriented in the <100> direction" noted above denotes that, where a thin film transistor is formed on a poly-Si film oriented in the <100> direction, the crystal grains oriented in the <100> direction are contained in the poly-Si film in an amount large enough to prevent practically satisfactorily the thin film transistor characteristics from being fluctuated by the mixing of crystal grains having crystal axis directions other than the <100> direction.

In the present invention, an insulating substrate is arranged first within a reaction apparatus. Then, a feed gas containing a silane series-gas is introduced into the reaction apparatus and thermally decomposed at 500° to 800° C. At the same time, power is applied so as to generate plasma within the feed gas. The feed gas is selected from the group consisting of a silane-series gas such as monosilane ($SiH_4$) and disilane ($Si_2H_6$) and a mixture of the silane-series gas with, if necessary, a carrier gas such as hydrogen gas or argon gas or a dopant gas such as phosphine ($PH_3$), arsine ($AsH_3$) or diborane ($B_2H_6$). Where silane is diluted with hydrogen, the dilution rate should not be high in order to obtain a strong orientation in the <100> direction.

In the present invention, the thermal decomposition should be carried out at 500° to 800° C. Under temperatures lower than 500° C., formed is a microcrystalline silicon film oriented in the <110> direction, which has a very small crystal grain size, or an amorphous silicon film, resulting in failure to form a poly-Si film oriented in the <100> direction. On the other hand, where the thermal decomposition temperature exceeds 800° C., the thermal decomposition reaction of the silane-series gas takes place at a rate higher than the effect of the plasma decomposition reaction. As a result, the application of power for plasma generation fails to produce its effect with respect to the crystal orientation of the formed film. It is of no difficulty for those skilled in the art to determine appropriately the optimum temperature, which depends on the other conditions for forming a poly-Si film, from within the range of 500° to 800° C.

Whether to use monosilane or disilane as a silane-series feed gas can be determined optionally. However, the effective deposition temperature of a poly-Si film with <100> orientation may be greatly changed by the kind of the selected silane-series feed gas. Monosilane is used in general. In the case of using disilane, the effective deposition temperature which permits orientation in the direction of <100> is considered to be transferred toward the lower side. To be more specific, disilane can be thermally decomposed at a temperature lower than the thermal decomposition temperature of monosilane. Also, in depositing an amorphous silicon film, the deposition temperature in the case of using disilane can be made lower than in the case of using monosilane. It follows that the effective deposition temperature is considered to be transferred toward the lower side, as noted above, in the case of using disilane.

The feed gas pressure should desirably be selected from within the range of between 100 mTorr and several Torr. Also, the flow rate of the feed gas, which depends on the shape of the thin film-forming apparatus, should desirably be determined such that the upper limit of the silicon film depositing rate should not exceed 1 to 2 μm/hour.

In the present invention, plasma is generated simultaneously with the thermal decomposition of the feed gas so as to deposit a poly-Si film oriented in the <100> direction. Power for the plasma generation should be kept controlled at a level lower than the power applied for the crystal orientation in the direction of <110> regardless of the other conditions for forming a poly-Si film. As a result, a poly-Si film with orientation in the direction of <100> can be obtained. The particular technical idea has been established by the present inventor. To be more specific, the orientation of the crystal grains of a silicon film depends on the depositing temperature, feed gas pressure, total flow rate of the feed gas and composition of the feed gas as well as the power for the plasma generation. The present inventor has found as reported later in detail that, when the power for the plasma generation is gradually increased from 0 W with the other depositing conditions set constant, the degree of orientation in the <100> direction is rapidly intensified to reach a maximum value and, then, is weakened. Thereafter, the orientation in the <110> direction is prominently intensified.

Further, the surface of the deposited silicon film is markedly roughened, when the power for plasma generation is not applied. However, when the crystal axis is oriented in the <100> direction by the plasma application in the method of the present invention, the deposited silicon film has a very smooth surface, the surface roughness being 30 Å or less.

Further, where the deposition is performed at a relatively low region within the deposition temperature range noted above, the rate of crystallization as a whole can be lowered while maintaining the intensity of orientation in the <100> direction. If such a poly-Si film is annealed at about 600° C. or lower so as to achieve a solid phase growth of crystal grains oriented in the <100> direction, it is possible to obtain a poly-Si film formed of large crystal grains which are strongly oriented in the <100> direction. In the present invention, methods other than the annealing treatment at 600° C. or lower can also be employed for increasing the size of the crystal grain. For example, it is possible to employ the method described in an article "Polycrystalline Si thin-film transistors fabricated at 800° C.: Effects of grain size and <110> fiber texture" by K. T. -Y. Kung and R. Reif, which is reported in "Journal of Applied Physics", Vol. 62, No. 4, 1987, pp 1503-1509. In this method, the ion channeling effect in the step of Si ion implantation is utilized for selecting the crystal grain acting as a seed in the process of the solid phase growth at low temperatures. The poly-Si film obtained by the method of Kung et al is formed of large crystal grains oriented in the <110> direction.

The ion channeling effect noted above denotes that, when ions are implanted into a crystalline silicon in a direction conforming with the direction of the crystal axis of the crystalline silicon, the probability of collision of the implanted ions against the silicon atoms is very low, with the result that the ions pass through the crystalline silicon with the crystallinity of the crystalline silicon substantially left unchanged. On the other hand, when ions are implanted in a direction differing from the direction of the crystal axis of the crystalline silicon, the ions collide against the silicon atoms to cause the silicon atoms to be deviated from the lattice position. Particularly, where ions are implanted in a high concentration, the crystalline silicon is converted into an amorphous silicon. Kung et al utilizes the effect described above. To be more specific, silicon ions are implanted into the surface of a poly-Si sample weakly oriented in the <110> direction. The ions are implanted in a direction conforming with the crystal axis direction of the sample so as to leave only crystal grains oriented in the <110> direction and to convert the crystal grains oriented in other directions into an amorphous state. Then, an annealing treatment is applied so as to achieve a solid phase crystal growth about the <110>-oriented crystal grains acting as nuclei. The resultant poly-Si film is formed of large crystal grains oriented in the <110> direction. In the present invention, however, most of the crystal grains are oriented in the <100> direction. Thus, when ions are implanted into the surface of a crystalline silicon sample in the direction conforming with the crystal axis direction of the crystalline silicon, the <100>-oriented crystal grains alone are left. Alternatively, the left crystal grains consist of a major portion of <100>-oriented crystal grains and a small amount of <110>-oriented crystal grains in which the ion channeling effect is most likely to take place. Then, an annealing treatment is applied so as to increase the size of the <100>-oriented crystal grains. Further, the <100> oriented poly-Si formed in the present invention can be used in the process of the solid phase crystal growth of an amorphous silicon film at low temperatures as a seed (or substrate) for controlling the crystal axis. In this method, it is possible to enable the amorphous silicon film to consist of large crystal grains oriented in the <100> direction like the substrate.

To be more specific, where an amorphous silicon film deposited on an amorphous substrate is crystallized by an annealing treatment, a crystal nuclei is formed first on the substrate surface or in the amorphous silicon film. The crystal nuclei grows in a solid phase so as to form a crystal grain. The growth of the crystal grain is finished when the adjacent crystal grains collide against each other so as to determine the size of the crystal grain. In other words, the crystal grain is small, if the density of crystal nuclei is high at an early stage of the solid phase crystal growth. In the prior art, the solid phase growth is carried out at a low temperature so as to suppress the number of nuclei formed and, thus, to increase the size of the crystal grains formed about the nuclei. In the prior art, however, the crystal axis direction in a crystal nuclei at an early stage of the solid phase crystal growth is not controlled. As a result, various crystal directions are brought about at random. Alternatively, since generation of the crystal nuclei oriented in the <111> direction is somewhat large, the poly-Si film formed by the prior art described above is considered to consist of crystal grains oriented at random or weakly oriented in the <111> direction.

In the present invention, an amorphous silicon film is deposited on a poly-Si film oriented in the <100> direction, followed by applying an annealing treatment so as to cause solid phase crystallization of the amorphous film. It is important for the oriented poly-Si film to have a clean surface immediately before deposition of the amorphous silicon. In other words, the surface of the oriented poly-Si film should not be stained with a natural oxide film or other contaminants. In this case, the <100>-oriented crystal grains on the surface of the oriented poly-Si film act as two dimensional crystal nuclei, and the amorphous silicon film is preferentially crystallized from the position contacting the two dimensional crystal nuclei while maintaining the same orienting properties so as to achieve a solid phase growth. If the growth of the crystal nuclei having another crystal direction is slow during the annealing treatment, i.e., if the solid phase crystal growth from the position contacting the <100> two dimensional crystal nuclei is faster than the forming rate of the crystal nuclei having another crystal direction, the amorphous silicon film after the crystallization is oriented in the <100> direction. Also, the size of the crystal grain is increased.

The present inventor has found that, where an amorphous silicon film deposited on a silicon dioxide (quartz) substrate is annealed, the amorphous film begins to be crystallized after a predetermined annealing time (which is defined herein as "induction time"). This implies that crystal nuclei are scarcely formed within the induction time. This phenomenon is utilized in the present invention for enlarging the crystal grains oriented in the <100> direction. In the present invention, a silicon oxide film is formed on a poly-Si film oriented in the <100> direction in a thickness large enough to prevent the substrate crystal grains oriented in the <100> direction from acting as the two dimensional crystal grains. Then, the silicon oxide film is partly removed in a stripe or circular shape so as to expose the surface of the oriented poly-Si film. Further, an amorphous silicon film is deposited, followed applying an annealing treatment at suitable low temperatures. In the method of the present invention, crystallization of the amorphous film deposited on the silicon oxide film is suppressed during the induction time noted above. Thus, the amorphous silicon is preferentially crystallized in a solid phase starting with the portion which is in contact with the substrate of the oriented poly-Si film via the silicon oxide-removed portion. The crystallized silicon is oriented like the substrate of the oriented poly-Si film. If the shape and area of the silicon oxide film to be removed are selected appropriately, it is possible to control the number of oriented two dimensional crystal nuclei in the exposed portion of the substrate. If the solid phase crystallization of the amorphous silicon from the portion in contact with the exposed surface of the oriented poly-Si film further proceeds, a solid phase crystal growth proceeds in the lateral direction toward the amorphous silicon positioned on the silicon oxide film. It follows that it is possible to further increase the size of the crystal in the oriented poly-Si phase and to control the positions of the large crystal grains on the surface of a silicon film.

EFFECT OF THE INVENTION

The poly-Si film of the present invention is strongly oriented in the <100> direction and has a smooth surface. When used for forming a thin film transistor, the poly-Si film of the present invention produces prominent effects, as summarized below:

1) The orientation in the direction of the <100> crystal axis permits lowering the surface state density near the interface between a silicon and a gate insulator film, leading to a small fluctuation in the threshold voltage and to an improved carrier mobility near the interface. Thus, as compared with the conventional poly-Si film, the poly-Si film of the present invention permits improving the characteristics of a thin film transistor. Also, the poly-Si film of the present invention, which has a smooth surface, can be used for forming a three dimensional integrated circuit in which elements having various functions are formed in a plurality of poly-Si films laminated one upon the other.

2) In the present invention, a plasma discharge decomposition reaction is utilized together with a thermal decomposition reaction of a feed gas for depositing a poly-Si film. Where the deposition temperature is set at 700° C. or lower, the deposition rate is considerably high in the present invention, compared with the prior art which utilizes the thermal decomposition reaction alone.

3) In the present invention, the power application is controlled for manufacturing a <100> oriented poly-Si film. This is effective for forming a pattern of <100> film. Specifically, the etching rate of a surface layer depends on the orientation direction of the crystal axis. The etching rate is the highest in the <100> oriented film and is the lowest in the <111> oriented film. Thus, a <110> oriented film is formed first on a substrate. Then, a <100> oriented film is formed on the <110> film by controlling the power application so as to form a poly-Si film. Finally, the <100> film is selectively etched to form a pattern of the <100> film on the <110> film.

4) In doping an impurity by a thermal diffusion method, the diffusion coefficient depends on the direction of the crystal axis. Thus, in the case of a poly-Si film of a two layer structure consisting of a <100> film and a <110> film, it is possible to selectively control the doping depth.

BRIEF DESCRIPTION OF THE DRAWINGS

FIG. 1 schematically shows an apparatus used in the Example of the present invention for manufacturing a poly-Si film; an FIGS. 2 and 3 are graphs each showing the relationship between the relative intensity of orientation along the crystal axis and the level of applied high frequency power.

DETAILED DESCRIPTION OF THE PREFERRED EMBODIMENTS

Figure 2:
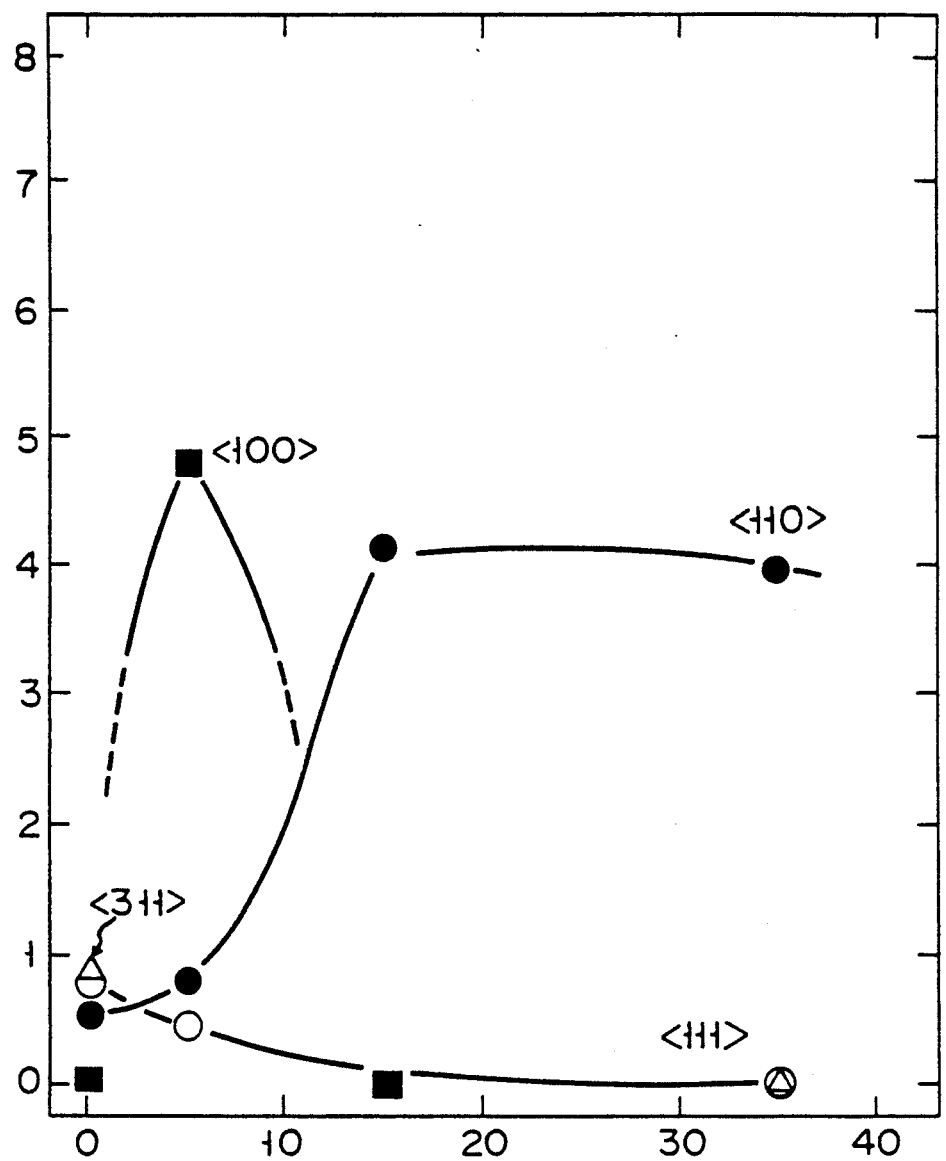

Let us describe more in detail the present invention with reference to Examples which follow.

EXAMPLE 1

A silicon film of the present invention was manufactured by using a thin film-manufacturing apparatus invented by the present inventor and disclosed in Japanese Patent Application No. 56-50904. FIG. 1 schematically shows the apparatus, which is an external heating induction coupling type apparatus. As seen from the drawing, a high frequency coil 2 for plasma generation is wound 20 times about a molten quartz reaction tube 1 having a diameter of 5 cm. The tube 1 of this construction is inserted into an electric furnace 3. A quartz or glass substrate 4 was disposed in the central portion of the high frequency coil 2. A mixed gas of silane and hydrogen (1:4) was used as a feed gas. A silicon film was deposited at a deposition temperature of 700° C., a gas pressure of 0.3 Torr, a total gas flow rate of 4 SCCM and a high frequency power changing from 0 W to 40 W. In this Example, the silicon film deposition rate was 0.4 to 0.6 μm/hour except for the case of high frequency power application of 0 W. A poly-Si film oriented in the <100> direction was obtained in the power application ranging between 3 W and 7 W. The film was oriented in the <110> direction in the power application of 10 W or higher. The degree of orientation in the <100> direction was very high in the case of applying a high frequency power of 5 W. Specifically, the crystal grains oriented in the <100> direction was 85% or more, in contrast to about 8% for the crystal grains oriented in the <111> direction and about 2 to 4% for the crystal grains oriented in the <110> and <311> directions, based on the sum of the relative intensities of the entire crystal grains. Further, the degree of surface roughness of the formed silicon film was measured by a surface roughness meter. Where the high frequency power application was 0 W, the surface roughness was found to be about 100 to 150 Å. Where a high frequency power of 3 W or more was applied, however, the surface of the formed silicon film was very smooth, i.e., 30 Å or less which is the lower limit detected by the surface roughness meter used.

The poly-Si film thus formed was thermally oxidized at 1000° C. so as to form a structure consisting of a metal film, a silicon oxide film and a poly-Si film. Then, a surface state density around the interface between the poly-Si film and the silicon oxide film was examined by a conductance method. The degree of orientation was also examined with respect to the poly-Si film after the thermal oxidation. In the case of using an X-ray intensity in the <111> direction as a basis, a noticeable change was not recognized in the degree of orientation, except that the intensity of orientation was slightly weakened in the silicon film which had exhibited a very strong <110> orientation in the application of a high frequency power of 15 W or higher. However, the films with strong orientation in the <100> and <110> directions exhibited an increase in the relative intensity by about 10 to 20%. The change in the surface state density caused by the high frequency power application well conforms with the change in the intensity of orientation in the <100> direction. The surface state density of a poly-Si film oriented in the <100> direction, which was deposited under a high frequency power application of 5 W, was found to be about 1/12 of the value of a silicon film oriented substantially at random, which was deposited with no application of a high frequency power. Likewise, the value of a poly-Si film oriented in the <110> direction, which was deposited under a high frequency power application of 15 W, was found to be about ½ of the value of the silicon film oriented substantially at random.

FIG. 2 shows the relative value of X-ray diffraction intensity of an undoped film in the case where the high frequency power was changed with the deposition temperature set constant at 700° C. in the method of the present invention. Further, FIG. 3 shows the relative intensity in the case where the deposition temperature was set at 700° C. and the flow ratio of silane (SiH$_4$) to diborane (B$_2$H$_6$) was set constant at $10^{-5}$. For defining the relative intensity, the X-ray signal intensity in every measuring direction was divided by each corresponding X-ray signal intensity for the silicon powder which was quite at random. Further, the difference in thickness of the samples was corrected by using a X-ray absorption coefficient of silicon. As seen from FIG. 2, a strong orientation in the <100> direction was observed at 5 W, and a strong orientation in the <110> direction at 15 W or higher. On the other hand, FIG. 3, which covers a boron-doped film, shows that the orientation in the <100> direction was further intensified at 3 W, i.e. power lower than 5 W. As apparent from the comparison between FIGS. 2 and 3 with respect to the cases of 15 W, the boron doping weakens the relative intensity to about one half in the films oriented in the <110> directions. FIGS. 2 and 3 also show that the power for plasma generation is lower in the formation of a poly-Si film with strong orientation in the <100> direction than in the formation of a poly-Si film with strong orientation in the <110> direction.

EXAMPLE 2

Poly-Si films were manufactured as in the manufacture of the undoped film in Example 1. In Example 2, however, the mixing ratio of silane to hydrogen was set at 1:2, 1:4 and 1:8 as well as 1:4 as in Example 1 in order to examine the change in the X-ray relative intensity and in the silicon deposition rate per hour. Table 1 shows the results together with the result of Example 1.

TABLE 1

| SiH$_4$/H$_2$ ratio | 1:8 | 1:4* | 1:4** | 1:2 |
|---|---|---|---|---|
| X-ray Relative Intensity | | | | |
| <111> | 1.2 | 0.25 | 0.44 | 0.21 |
| <110> | 1.2 | 1.4 | 0.81 | 1.7 |
| <311> | 1.2 | 0.29 | ~0 | 0.08 |
| <100> | 0 | 4.0 | 4.8 | 7.8 |
| Deposition rate (μm/hour) | 0.12 | 0.42 | 0.45 | 1.1 |

*Example 2; **Example 1
Note:
(1) The definition of Relative Intensity is as in FIGS. 2 and 3.
(2) The deposition was carried out under a deposition temperature of 700° C., a high frequency power of 5 W, a pressure of 0.3 Torr and a flow rate of 4 SCCM, as in the undoped film (5 W) shown in FIG. 2, the sole difference being the hydrogen dilution rate.

As seen from Table 1, the relative intensity in the <100> direction is much increased with decrease in the hydrogen content of the feed gas mixture, i.e., with change from 1:8 toward 1:2. The relative intensity in the <311> direction is decreased with decrease in the hydrogen content. The relative intensity in the <111> direction is somewhat decreased with decrease in the hydrogen content. Further, the relative intensity in the <110> direction is not appreciably changed with change in the hydrogen content of the feed gas mixture.

Table 1 clearly suggests that, in order to obtain a poly-Si film with strong orientation in the <100> direction, the mixing ratio of hydrogen to silane should not be increased. The reason is not clear at this stage. However, the present inventor pay attentions to the fact that the deposition rate is much increased with decrease in the hydrogen content, as seen from Table 1. According to the inventor, the deposition rate should be high to some extent in order to obtain a strong orientation in the <100> direction. If the deposition rate is unduly high, however, the surface of the poly-Si film formed is roughened even under the plasma application during the film formation. As a matter of fact, the surface roughness of the sample with the silane to hydrogen ratio of 1:2 was found to be 40 to 50 Å, which was somewhat higher than that of the sample with the ratio of 1:4. Under the circumstances, the preferable upper limit of the deposition rate per hour is considered to be about 1 to 2 μm in order to obtain a poly-Si film strongly oriented in the <100> direction and having a smooth surface.

EXAMPLE 3

Undoped films were manufactured as in Example 1, except that the deposition temperature wa changed from 700° to 800° C. In this experiment, the high frequency power was set constant at 5 W, at which a strong orientation in the <100> direction was achieved under a deposition temperature of 700° C. The relative X-ray diffraction intensity was measured with respect to the undoped films thus manufactured so as to examine the change with the deposition temperature in the relative intensity. The relative intensity in the <110> direction was found to begin to increase at around 620° C., reaching the maximum value around 650° C. and, then, rapidly decreasing over deposition temperatures higher than 650° C. On the other hand, the relative intensity in the <100> direction was found to begin to increase around 650° C., reaching the maximum value around 700° C. and, then, gradually decreasing over deposition temperatures higher than 700° C. Further, the relative intensity in the directions of <111> and <311> was found to be weaker than that in the directions of <110> and <100> over the entire temperature range, and to monotonously increase slightly with increase in the deposition temperature.

The experimental results indicate that the orientation in the direction in which the relative intensity in a certain direction constitutes a main signal compared with a signal in another direction is observed within a range of 620° to 680° C. with respect to the orientation in the <110> direction and within a range of 680° to 750° C. with respect to the orientation in the <100> direction. The dependence on the deposition temperature is very close to that of the orientation in each direction of a poly-Si film deposited by a thermal CVD under the ordinary low gas pressure (LPCVD). On the other hand, the orientation in the <100> direction is not observed over the entire range of the deposition temperature, if the high frequency power is set at 15 W or higher.

Let us estimate the depositing conditions permitting the orientation in the <100> direction, in view of the similarity between the present results and the dependence on the deposition temperature of the orientation of a LPCVD film. In the case of a LPCVD film, the orientation in the <100> direction is observed within a certain deposition temperature range when the silane pressure is set constant. If the silane pressure is decreased, both the upper and lower limits of the deposition temperature range within which the orientation in the <100> direction is observed are shifted toward the lower temperature region. Incidentally, the range within which the orientation in the <110> direction is observed is also shifted, and kept lower than that within which the <100> orientation is observed. Each of the increase in the deposition temperature and the decrease in the gas pressure serves to increase the kinetic energy of the reactive molecules adsorbed on the substrate surface. The increased kinetic energy within a suitable range is considered to make it possible to achieve the orientation in the <100> direction.

The plasma application also serves to increase the kinetic energy. In addition, the plasma application produces a physical effect that weak Si-Si bonds are removed by the sputtering effect. This physical effect, which is supposed to be one of the reasons for smoothing the surface of the deposited silicon film, is also considered to affect the orientation of the poly-Si film. As a matter of fact, the plane in the <100> direction of a single-crystalline silicon is likely to be etched easily, compared with the <110> or <111> direction. If the high frequency power is increased to increase the sputtering effect in the poly-Si film of the present invention, the orientation in the <100> direction is changed to the orientation in the <110> direction which is unlikely to be etched. Thus, the upper limit of the high frequency power which permits the orientation in the <100> direction is not considered to be changed greatly by the other depositing conditions noted previously. However, the decrease in the deposition temperature or the increase in the gas pressure, which decreases the kinetic energy of the reactive molecules absorbed on the substrate surface, may somewhat increase the upper limit of the high frequency power to increase the kinetic energy.

The lower limit exists in the deposition temperature, too. Under deposition temperatures lower than about 600° C., a large difference takes place in the deposition rate between the ordinary LPCVD film and the plasma-enhanced CVD film (PECVD), as shown in, for example, FIG. 1(a) on page 4155 of "Journal of Applied Physics, Vol. 64, No. 8, 1988". Thus, under application of a relatively low level of high frequency power which permits orientation to the <100> direction, a PECVD film may be not crystallized but is likely to be made amorphous because the deposition temperature is low and the deposition rate for PECVD films is higher than that for LPCVD films.

Where a poly-Si film is used for forming a thin film transistor, the gate insulator film formed on the poly-Si film is about 500 Å thick. The poly-Si film of the present invention is low in its surface roughness and, thus, produces no problem when used in a thin film transistor. On the other hand, the present inventor has found that the poly-Si film formed by the conventional LPCVD method has a surface roughness of 100 Å or more under the deposition temperature of 600° C. or more which permits orientation in the <100> direction. Clearly, it is impossible to use the poly-Si film formed by the conventional LPCVD method in a thin film transistor. Further, the surface roughness of the conventional LPCVD film is increased with increase in the degree of orientation. It is reported that the surface roughness of a LPCVD film strongly oriented in the <100> direction is increased to reach 2000 Å.

What is claimed is:

1. A method of manufacturing a poly-Si film, in which silicon is deposited on a substrate by means of a thermal decomposition of a feed gas and plasma generation, comprising:

the step of arranging said substrate within a reaction apparatus;

the step of introducing into said reaction apparatus a feed gas containing a silane-series gas for thermal decomposition of the feed gas at 500° to 800° C.; and the step of generating plasma within the feed gas by applying power for the plasma generation simultaneously with the thermal decomposition, said power for plasma generation being controlled at a level lower than the power applied for forming a poly-Si film oriented in the <110> direction, so as to form, prior to annealing, a poly-Si film substantially oriented in the <100> direction and having a smooth surface.

2. The method of manufacturing a poly-Si film according to claim 1, wherein said feed gas is selected from the group consisting of a silane series gas, a mixed gas of a silane series gas and a carrier gas, a mixed gas of a silane series gas and a dopant gas, and a mixed gas of a silane series gas, a dopant gas and a carrier gas.

3. The method of manufacturing a poly-Si film according to claim 2, wherein said silane series gas is selected from the group consisting of monosilane, disilane and a mixture thereof, said carrier gas is selected from the group consisting of hydrogen, argon and a mixture thereof, and said dopant gas is selected from the group consisting of phosphine, arsine, diborane and a mixture thereof.

4. The method of manufacturing a poly-Si film according to claim 2, wherein said carrier gas includes hydrogen and the volume ratio of silane to hydrogen in said silane series gas to hydrogen is at least 1/8.

5. The method of manufacturing a poly-Si film according to claim 1, wherein said thermal decomposition is carried out at 500° to 800° C.

6. The method of manufacturing a poly-Si film according to claim 1, wherein the pressure within the reaction apparatus of the feed gas is set to fall within the range of between 100 mTorr and 10 Torr.

7. The method of manufacturing a poly-Si film according to claim 1, wherein the flow rate of the feed gas into the reaction apparatus is controlled to permit the upper limit of the silicon film deposition rate not to exceed 1 to 2 μm/hour.

8. A method of manufacturing a poly-Si film according to claim 1, wherein said method comprises a step of forming a poly-Si film oriented in the <110> direction on the substrate, and step of forming a poly-Si film oriented in the <100> direction and having a smooth surface.

9. A method of manufacturing a poly-Si film, in which silicon is deposited on a substrate by means of a thermal decomposition of a feed gas and plasma generation, comprising:

the step of arranging said substrate within a reaction apparatus;

the step of introducing into said reaction apparatus a feed gas containing a silane-series gas for thermal decomposition of the feed gas at 500° to 800° C.;

the step of generating plasma within the feed gas by applying power for the plasma generation simultaneously with the thermal decomposition, said power for plasma generation being controlled at a level lower than the power applied for forming a poly-Si film oriented in the <110> direction, so as to form, prior to annealing, a poly-Si film substantially oriented in the <100> direction and having a smooth surface; and the step of applying a treatment for increasing the size of the crystal grains to the poly-Si film obtained in the preceding step.

10. The method of manufacturing a poly-Si film according to claim 9, wherein the size-increasing step comprises annealing the poly-Si film at 600° C. or less.

11. The method of manufacturing a poly-Si film according to claim 9, wherein the treatment for increasing the crystal grain size comprises the steps of:

implanting silicon ions into a poly-Si film, which is substantially oriented in the <100> direction, in a direction of the crystal axis of the poly-Si film for making amorphous at least some of the crystal grains oriented in directions other than the <100> direction; and applying an annealing treatment so as to increase the size of the crystal grains oriented in the <100> direction.

12. The method of manufacturing a poly-Si film according to claim 9, wherein the treatment for increasing the crystal grain size comprises the steps of:

depositing an amorphous silicon film on a poly-Si film, which is substantially oriented in the <100> direction; and applying an annealing treatment at a predetermined temperature so as to permit the amorphous silicon in contact with the poly-Si film oriented in the <100> direction to be preferentially crystallized in an oriented manner like the poly-Si film oriented in the <100> direction and, then, to proceed to a solid phase growth.

13. The method of manufacturing a poly-Si film according to claim 9, wherein the treatment for increasing the crystal grain size comprises the steps of:

forming a silicon oxide film on a poly-Si film substantially oriented in the <100> direction;

selectively removing the silicon oxide film to partly expose the surface of the poly-Si film;

depositing an amorphous silicon film on the silicon film; and applying an annealing treatment at a predetermined temperature so as to permit the amorphous silicon positioned in contact with the poly-Si film to proceed to a solid phase crystal growth.

14. A method of manufacturing a poly-Si film oriented in the <100> direction and having a smooth surface as recited in claim 1, wherein a poly-Si film oriented in the <110> direction is formed first on said substrate.

* * * * *